(12) United States Patent
Zhao et al.

(10) Patent No.: US 11,773,489 B2
(45) Date of Patent: Oct. 3, 2023

(54) GAS CONFINER ASSEMBLY FOR ELIMINATING SHADOW FRAME

(71) Applicant: Applied Materials, Inc., Santa Clara, CA (US)

(72) Inventors: Lai Zhao, Campbell, CA (US); Qunhua Wang, Santa Clara, CA (US); Robin L. Tiner, Santa Cruz, CA (US); Soo Young Choi, Fremont, CA (US); Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 726 days.

(21) Appl. No.: 14/610,531

(22) Filed: Jan. 30, 2015

(65) Prior Publication Data

US 2015/0211121 A1    Jul. 30, 2015

Related U.S. Application Data

(60) Provisional application No. 61/933,823, filed on Jan. 30, 2014.

(51) Int. Cl.
*C23C 16/455* (2006.01)
*H01J 37/32* (2006.01)
*C23C 16/458* (2006.01)

(52) U.S. Cl.
CPC .... *C23C 16/45591* (2013.01); *C23C 16/4585* (2013.01); *H01J 37/32449* (2013.01); *H01J 37/32715* (2013.01)

(58) Field of Classification Search
CPC .......... C23C 16/45591; C23C 16/4585; C23C 16/50–517; H01J 37/32715;
(Continued)

(56) References Cited

U.S. PATENT DOCUMENTS

| 6,033,480 A | 3/2000 | Chen et al. |
| 6,096,135 A | 8/2000 | Guo et al. |

(Continued)

FOREIGN PATENT DOCUMENTS

| CN | 1591793 A | 3/2005 |
| CN | 1754978 A | 4/2006 |

(Continued)

OTHER PUBLICATIONS

PCT Notification of Transmittal of the International Search Report and the Written Opinion of the International Searching Authority for International Application No. PCT/US2015/011974 dated May 29, 2015, 11 total pages.

(Continued)

*Primary Examiner* — Ram N Kackar
*Assistant Examiner* — Laureen Chan
(74) *Attorney, Agent, or Firm* — Patterson + Sheridan, LLP

(57) ABSTRACT

The present disclosure relates to a gas confiner assembly designed to reduce the non-uniform deposition rates by confining the gas flow and changing the local gas flow distribution near the edge regions of the substrate. The material, size, shape and other features of the gas confiner assembly can be varied based on the processing requirements and associated deposition rates. In one embodiment, a gas confiner assembly for a processing chamber comprises a gas confiner configured to decrease gas flow and compensate for high deposition rates on edge regions of substrates. The gas confiner assembly also comprises a cover disposed below the gas confiner. The cover is configured to prevent a substrate support from being exposed to plasma.

19 Claims, 4 Drawing Sheets

(58) Field of Classification Search
CPC ........... H01J 37/32449; H01J 37/32642; H01J 37/32; H01L 21/68721; H01L 21/68735
See application file for complete search history.

(56) References Cited

U.S. PATENT DOCUMENTS

| | | | |
|---|---|---|---|
| 6,159,299 | A | 12/2000 | Koai et al. |
| 6,344,105 | B1* | 2/2002 | Daugherty ........ H01J 37/32623 156/345.51 |
| 6,364,957 | B1 | 4/2002 | Schneider et al. |
| 7,024,105 | B2* | 4/2006 | Fodor ................ C23C 16/4585 118/50.1 |
| 7,670,436 | B2 | 3/2010 | Miller et al. |
| 2002/0029745 | A1* | 3/2002 | Nagaiwa ............ C23C 16/4581 118/723 E |
| 2002/0066531 | A1* | 6/2002 | Ke ..................... H01J 37/32623 156/345.1 |
| 2003/0106646 | A1* | 6/2003 | Ma ..................... C23C 16/4585 156/345.51 |
| 2005/0034673 | A1* | 2/2005 | Kim ................... C23C 16/4585 118/728 |
| 2005/0266174 | A1* | 12/2005 | Hou ................... C23C 16/4585 427/569 |
| 2006/0011137 | A1 | 1/2006 | Keller |
| 2006/0016561 | A1* | 1/2006 | Choi ................. H01J 37/32623 156/345.51 |
| 2006/0060302 | A1 | 3/2006 | White et al. |
| 2006/0090706 | A1 | 5/2006 | Miller et al. |
| 2007/0102286 | A1* | 5/2007 | Scheible ............. C23C 14/3407 204/298.01 |
| 2008/0152838 | A1 | 6/2008 | Sen et al. |
| 2009/0107955 | A1 | 4/2009 | Tiner et al. |
| 2010/0065216 | A1 | 3/2010 | Tiller et al. |
| 2010/0122655 | A1* | 5/2010 | Tiner .................... C23C 16/042 118/504 |
| 2011/0304086 | A1* | 12/2011 | Liu ...................... B23K 20/122 269/296 |
| 2013/0228124 | A1 | 9/2013 | Furuta et al. |
| 2013/0263782 | A1 | 10/2013 | Wang et al. |

FOREIGN PATENT DOCUMENTS

| | | |
|---|---|---|
| CN | 101089220 A | 12/2007 |
| CN | 100437969 C | 11/2008 |
| CN | 102337511 A | 2/2012 |
| CN | 102543798 A | 7/2012 |
| CN | 102776491 A | 11/2012 |
| EP | 0434227 A1 | 6/1991 |
| JP | 06340975 | 12/1994 |
| JP | H09-191003 A | 7/1997 |
| JP | 2002217172 A | 8/2002 |
| JP | 2005-142529 A | 6/2005 |
| JP | 2006-104575 A | 4/2006 |
| JP | 2006-140473 A | 6/2006 |
| JP | 2010232694 A | 10/2010 |
| JP | 201244145 A | 3/2012 |
| KR | 1020060046379 A | 5/2006 |
| KR | 100610010 B1 | 8/2006 |
| KR | 20090095864 A | 9/2009 |

OTHER PUBLICATIONS

PCT Search Report dated Nov. 24, 2014, for Application No. PCT/US2014/040969.
Chinese Office Action (with attached English translation) for Application No. 201580006247.7; dated May 3, 2018; 12 total pages.
Taiwanese Office Action (with attached English translation) for Application No. 104102082; dated Jun. 27, 2018; 17 total pages.
Taiwanese Office Action for Application No. 104102082; dated Mar. 28, 2019; 10 total pages.
Japanese Office Action (with attached English translation) for Application No. 2016-545835; dated Jan. 8, 2019; 11 total pages.
Chinese Office Action (with attached English translation) for Application No. 201580006247.7; dated Jul. 23, 2019; 5 total pages.
Taiwanese Office Action for Application No. 104102082; dated Nov. 27, 2019; 5 total pages.
Japanese Office Action issued to 2019-143544 dated Nov. 4, 2020.
Korean Office Action issued to 10-2016-7023766 dated Jun. 21, 2021.
Chinese Office Action dated Apr. 16, 2021 for Application No. 201910993702.7.
Chinese Office Action dated Jan. 25, 2022 for Application No. 201910993702.7.
Chinese Office Action dated Sep. 8, 2021 for Application No. 201910993702.7.
Chinese Office Action (with attached English translation) for Application No. 201580006247.7; dated Sep. 21, 2018; 11 total pages.
Taiwanese Office Action for Application 104102082; dated Dec. 6, 2018; 11 total pages.

* cited by examiner

GAS CONFINER ASSEMBLY FOR ELIMINATING SHADOW FRAME

CROSS-REFERENCE TO RELATED APPLICATIONS

This application claims benefit of U.S. Provisional Patent Application Ser. No. 61/933,823, filed Jan. 30, 2014, which is hereby incorporated herein by reference.

BACKGROUND OF THE DISCLOSURE

1. Field

Embodiments of the disclosure generally relate to a gas confiner assembly for improving profile uniformity and method for distributing gas in a processing chamber.

2. Description of the Background Art

Liquid crystal displays or flat panels are commonly used for active matrix displays such as computer and television monitors. Plasma enhanced chemical vapor deposition (PECVD) is generally employed to deposit thin films on a substrate such as a transparent substrate for flat panel display or semiconductor wafer. PECVD is generally accomplished by introducing a precursor gas or gas mixture, e.g., silane ($SiH_4$) and nitrogen ($N_2$), into a vacuum chamber that contains a substrate. The precursor gas or gas mixture is typically directed downwardly through a distribution plate situated near the top of the chamber. The precursor gas or gas mixture in the chamber is energized (e.g., excited) into a plasma by applying radio frequency (RF) power to the chamber from one or more RF sources coupled to the chamber. The excited gas or gas mixture reacts to form a layer of material, e.g., silicon nitride ($SiN_x$), on a surface of the substrate that is positioned on a temperature controlled substrate support. The silicon nitride layer forms passivation layers, gate insulators, buffer layers, and/or etch stop layers for a low temperature poly silicon (LTPS) film stack in the next generation thin film transistors (TFT) and active matrix organic light emitting diodes (AMOLED). TFT and AMOLED are but two types of devices for forming flat panel displays.

Flat panels processed by PECVD techniques are typically large, often exceeding 4 square meters. As the size of substrates continues to grow in the flat panel display industry, film thickness and film uniformity control for large area PECVD becomes an issue. Shadow frames are typically used in PECVD to protect the substrate support from plasma. However, because shadow frames cover the outer most edge of the substrate, they: (1) increase the edge exclusion (EE) by 3 mm to 5 mm; and (2) negatively affect the film deposition near the perimeter/edge regions of the substrate. One way to improve the edge uniformity is to eliminate the shadow frame. However, eliminating the shadow frame still leaves a perimeter region of the substrate support surface exposed to the plasma, which may result in higher deposition rates at the edge region of the substrate due to the offset between the substrate and the uncovered substrate support surface. Additionally, if the substrate support surface is exposed to the plasma, it may lead to plasma arcing and non-uniform deposition.

Therefore, there is a need for improving the deposition rate and film profile uniformity in substrates.

SUMMARY

The present disclosure generally relates to a gas confiner assembly designed to decrease high deposition rates on edge regions of substrates by confining the gas flow and changing the local gas flow distribution near the edge regions of the substrate. The material, size, shape and other features of the gas confiner assembly can be varied based on the processing requirements and associated deposition rates.

In one embodiment, a gas confiner assembly for a processing chamber includes a gas confiner configured to decrease gas flow and compensate for high deposition rates on edge regions of substrates. The gas confiner assembly also includes a cover disposed below the gas confiner. The cover is configured to prevent a substrate support from being exposed to plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a gas confiner assembly designed to decrease high deposition rates on edge regions of substrates by re-distributing gas flow. According to embodiments described herein, the gas confiner reduces the non-uniform deposition rates by confining the gas flow and changing the local gas flow distribution near the edge regions of the substrate. The material, size, shape and other features of the gas confiner assembly can be varied based on the processing requirements and associated deposition rates.

Embodiments herein are illustratively described below in reference to a PECVD system configured to process large area substrates, such as a PECVD system, available from AKT, a division of Applied Materials, Inc., Santa Clara, Calif. However, it should be understood that the disclosure has utility in other system configurations such as etch systems, other chemical vapor deposition systems and any other system in which distributing gas within a process chamber is desired, including those systems configured to process round substrates.

Figure 1:
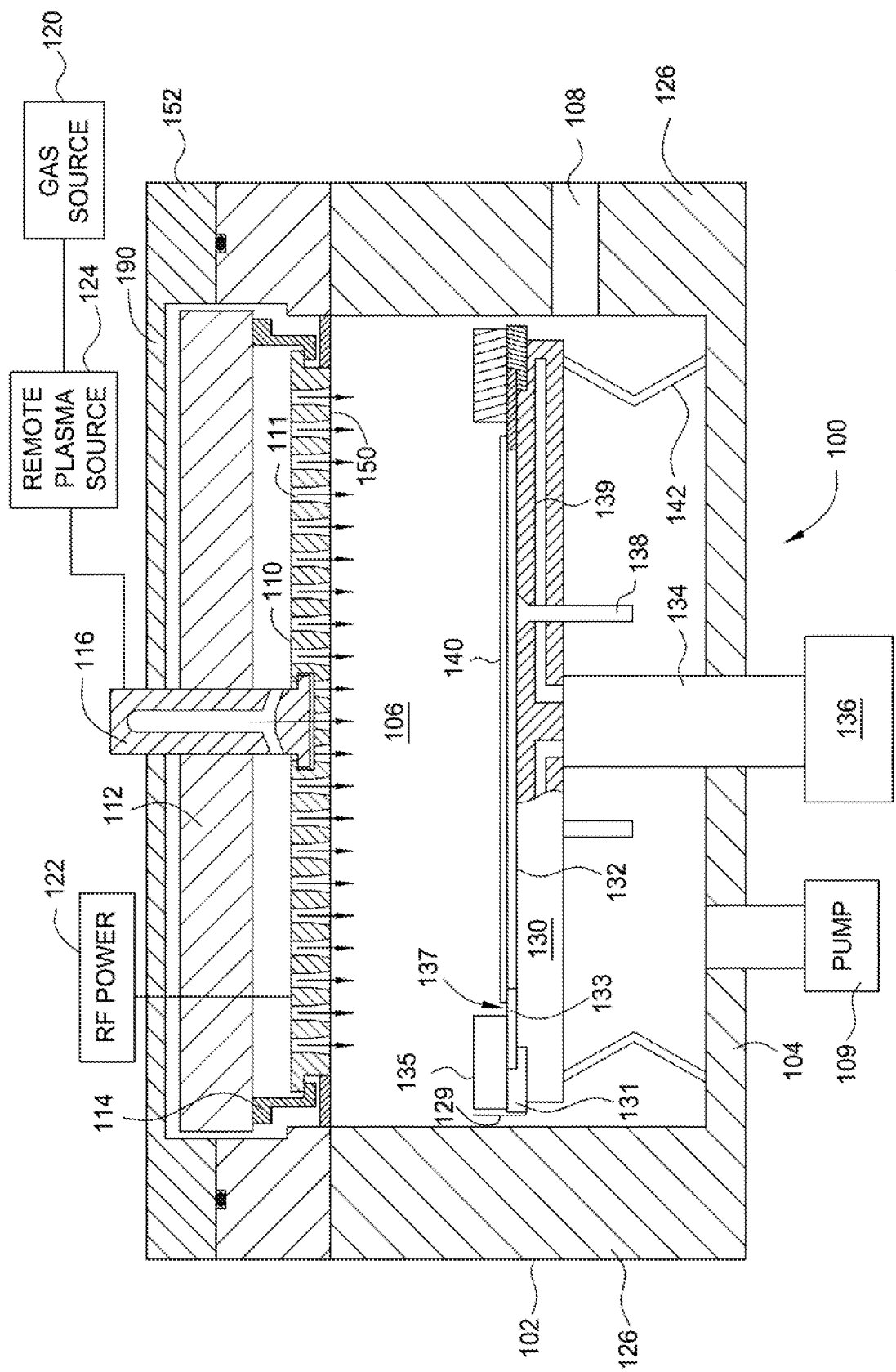
FIG. 1 is a schematic cross-section view of one embodiment of a PECVD chamber having a gas confiner assembly.

FIG. 1 is a schematic cross-section view of one embodiment of a PECVD chamber 100 for forming electronic devices, such as TFT and AMOLED. It is noted that FIG. 1 is just an exemplary apparatus that may be used to electronic devices on a substrate. One suitable PECVD chamber is available from Applied Materials, Inc., located in Santa Clara, Calif. It is contemplated that other deposition chambers, including those from other manufacturers, may be utilized to practice the present disclosure.

The chamber 100 generally includes walls 102, a bottom 104, and a gas distribution plate or diffuser 110, and a substrate support 130 which define a process volume 106. In one embodiment, the substrate support 130 is fabricated from aluminum. The process volume 106 is accessed through a sealable slit valve 108 formed through the walls 102 such that a substrate 140, may be transferred in and out of the chamber 100. In one embodiment, the substrate 140 is 1850 mm×1500 mm. The substrate support 130 includes a substrate receiving surface 132 for supporting the substrate 140 and a stem 134 coupled to a lift system 136 to raise and lower the substrate support 130.

A gas confiner assembly 129 is disposed around the periphery of the substrate support 130. The gas confiner assembly 129 is configured to decrease high deposition rates on edge regions of the substrate 140. In one embodiment, the gas confiner assembly 129 includes a base 131, a cover 133, and a gas confiner 135. The base 131 is configured to support the gas confiner 135, and the cover 133 is configured to cover the substrate support 130 when the substrate 140 is disposed thereon during processing, i.e., prevent the substrate support 130 from being exposed to plasma. In one embodiment, the cover 133 overlaps the substrate 140 by 10 mm, or by 5 mm during processing temperatures, e.g., 400 degrees Celsius. Even if the substrate 140 is misaligned with the substrate support 130, the cover 133 advantageously protects the substrate support 130 from plasma. Details of the gas confiner assembly 129 will be discussed below.

Lift pins 138 are moveably disposed through the substrate support 130 to move the substrate 140 to and from the substrate receiving surface 132 to facilitate substrate transfer. The substrate support 130 may also include heating and/or cooling elements 139 to maintain the substrate support 130 and substrate 140 positioned thereon at a desired temperature. The substrate support 130 may also include grounding straps 142 to provide RF grounding at the periphery of the substrate support 130.

The diffuser 110 is coupled to a backing plate 112 at its periphery by a suspension 114. The diffuser 110 may also be coupled to the backing plate 112 by one or more center supports 116 to help prevent sag and/or control the straightness/curvature of the diffuser 110. A gas source 120 is coupled to the backing plate 112 to provide one or more gases through the backing plate 112 to a plurality of gas passages 111 formed in the diffuser 110 and to the substrate receiving surface 132. Suitable gases may include, but are not limited to, a silicon containing gas, e.g., silane ($SiH_4$), a nitrogen containing gas, e.g., nitrogen ($N_2$), nitrous oxide ($N_2O$) and/or ammonia ($NH_3$), an oxygen containing gas, e.g., oxygen ($O_2$), and argon (Ar). A vacuum pump 109 is coupled to the chamber 100 to control the pressure within the process volume 106. An RF power source 122 is coupled to the backing plate 112 and/or to the diffuser 110 to provide RF power to the diffuser 110 to generate an electric field between the diffuser 110 and the substrate support 130 so that a plasma may be formed from the gases present between the diffuser 110 and the substrate support 130. Various RF frequencies may be used, such as a frequency between about 0.3 MHz and about 200 MHz. In one embodiment, the RF power source 122 provides power to the diffuser 110 at a frequency of 13.56 MHz.

A remote plasma source 124, such as an inductively coupled remote plasma source, may also be coupled between the gas source 120 and the backing plate 112. Between processing substrates, a cleaning gas may be provided to the remote plasma source 124 and excited to form a remote plasma from which dissociated cleaning gas species are generated and provided to clean chamber components. The cleaning gas may be further excited by the RF power source 122 provided to flow through the diffuser 110 to reduce recombination of the dissociated cleaning gas species. Suitable cleaning gases include but are not limited to $NF_3$, $F_2$, and $SF_6$.

In one embodiment, the heating and/or cooling elements 139 may be utilized to maintain the temperature of the substrate support 130 and substrate 140 thereon during deposition less than about 400 degrees Celsius or less. In one embodiment, the heating and/or cooling elements 139 may used to control the substrate temperature to less than 100 degrees Celsius, such as between 20 degrees Celsius and about 90 degrees Celsius.

The spacing during deposition between a top surface of the substrate 140 disposed on the substrate receiving surface 132 and a bottom surface 150 of the diffuser 110 may be between about 400 mm and about 1,200 mm, for example between about 400 mm and about 800 mm, for example between about 400 mm to about 600 mm, for example about 500 mm. In one embodiment, the bottom surface 150 of the diffuser 110 may include a concave curvature wherein the center region is thinner than a peripheral region thereof.

The chamber 100 may be used to deposit amorphous silicon (aSi), a nitride, e.g., silicon nitride ($SiN_x$), and/or an oxide, e.g., silicon oxide ($SiO_x$) by a PECVD process which is widely used as a passivation layer, a gate insulator film, a buffer layer or an etch stop layer in TFT and AMOLED. The uniformity (i.e., thickness) of the deposited amorphous silicon, nitride or oxide layer has a significant impact on the final device performance, such as threshold voltage and drain current uniformity. In one embodiment, a film uniformity of about 5%, or less, across the surface of the substrate and at a 10 mm EE (instead of the conventional 15 mm EE) is desired. While many strides have been made toward this goal, there are regions of the substrate 140 where this uniformity is not achieved. For example, edges of the substrate experience a higher or lower deposition rate which results in film thicknesses at these regions that is greater or less than other regions. Although not wishing to be bound by theory, the cause of higher deposition rates in the edge regions is attributed to gas flow driven processes, as opposed to plasma-driven processes. An inventive gas confiner assembly has been developed and tested to overcome these effects and minimize non-uniformities in films on the edge regions of the substrate 140.

Figure 2:
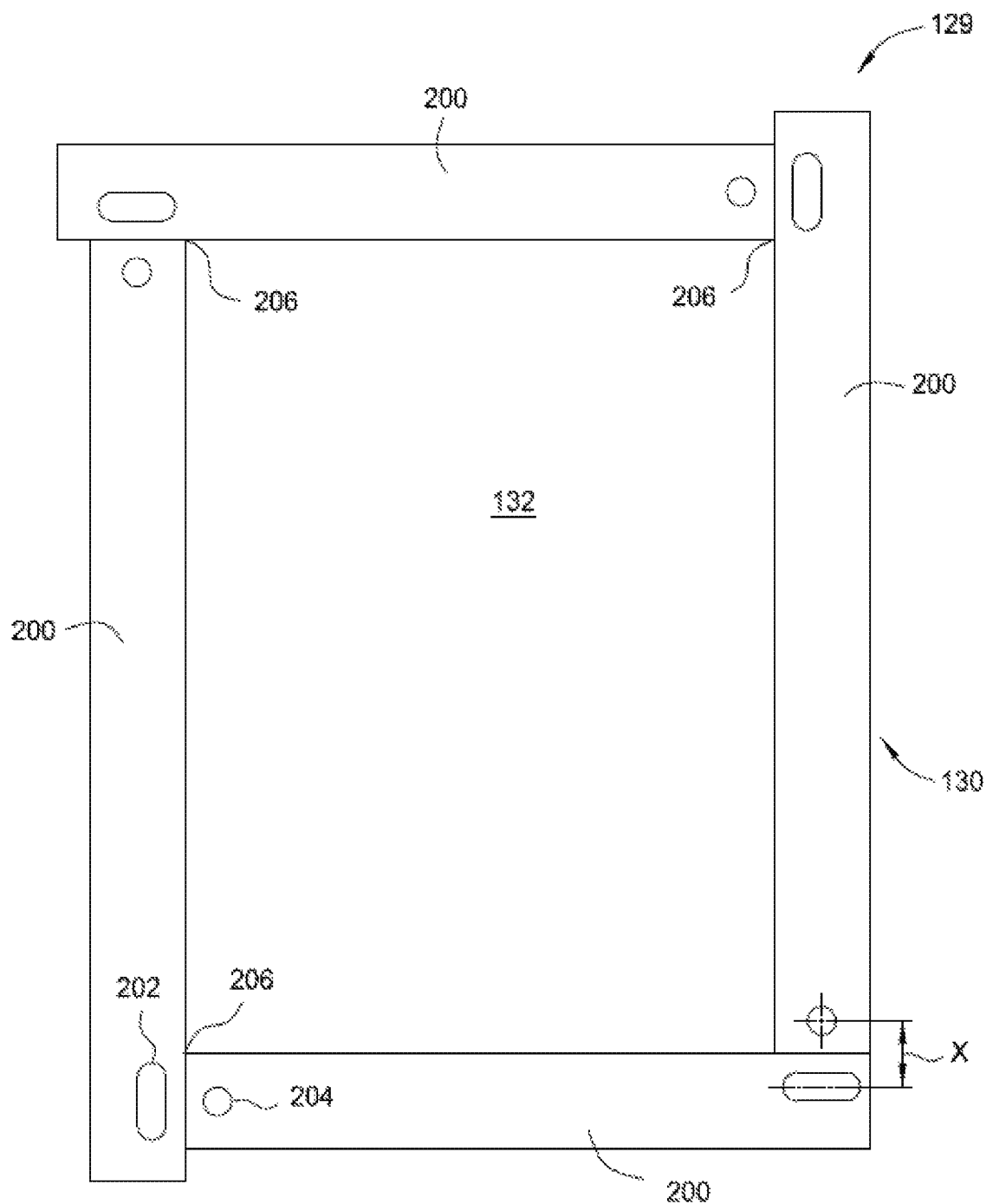
FIG. 2 is a plan view of one embodiment of a gas confiner assembly surrounding the substrate support of FIG. 1.

FIG. 2 is a plan view of one embodiment of the cover 133 of the gas confiner assembly 129 surrounding the substrate support 130 (the gas confiner base 131 and the gas confiner 135 are removed for clarity). Referring to FIGS. 1 and 2, the gas confiner assembly is 129 is configured to confine the gas flow and change the local distribution of the gas flow being deposited on the edge regions of the substrate 140. In one embodiment, the gas confiner assembly 129 reduces high deposition rates at the edges of the substrate 140, without affecting the large range uniformity profile of the substrate 140.

Figure 3:
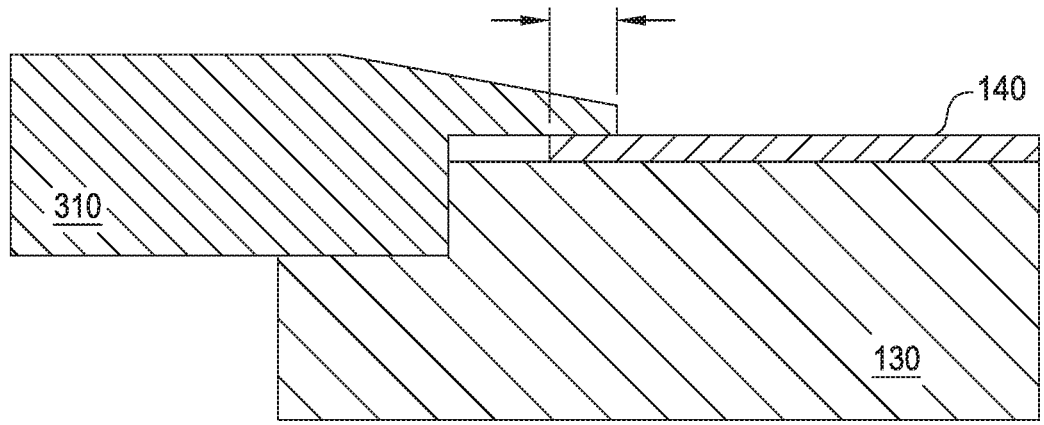
FIG. 3 is a cross-sectional side view of one embodiment of a conventional shadow frame assembly.

FIG. 3 is a cross-sectional side view of one embodiment of a conventional shadow frame assembly. The shadow frame 310 overlaps a peripheral edge of the substrate 140, which is disposed on a substrate support 130. The shadow frame 310 offers the advantage of protecting the substrate support 130 from plasma during PECVD processing. However, the disadvantages of the shadow frame 310 include that it covers the peripheral edge of the substrate 140, thereby increasing edge exclusion and preventing or limiting film deposition in the peripheral region of the substrate 140, leading to decreased edge uniformity. Removal of the shadow frame 310 also results in non-uniform deposition at the periphery because of excessive plasma deposition on the peripheral edge of the substrate 140, as well as potential plasma arcing.

Figure 4:
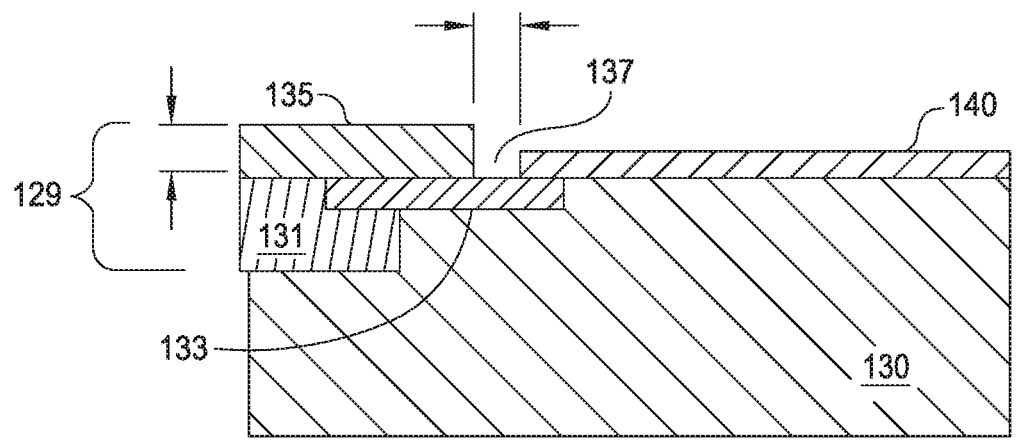
FIG. 4 is a cross-sectional side view of one embodiment of a gas confiner assembly.
Figure 5:
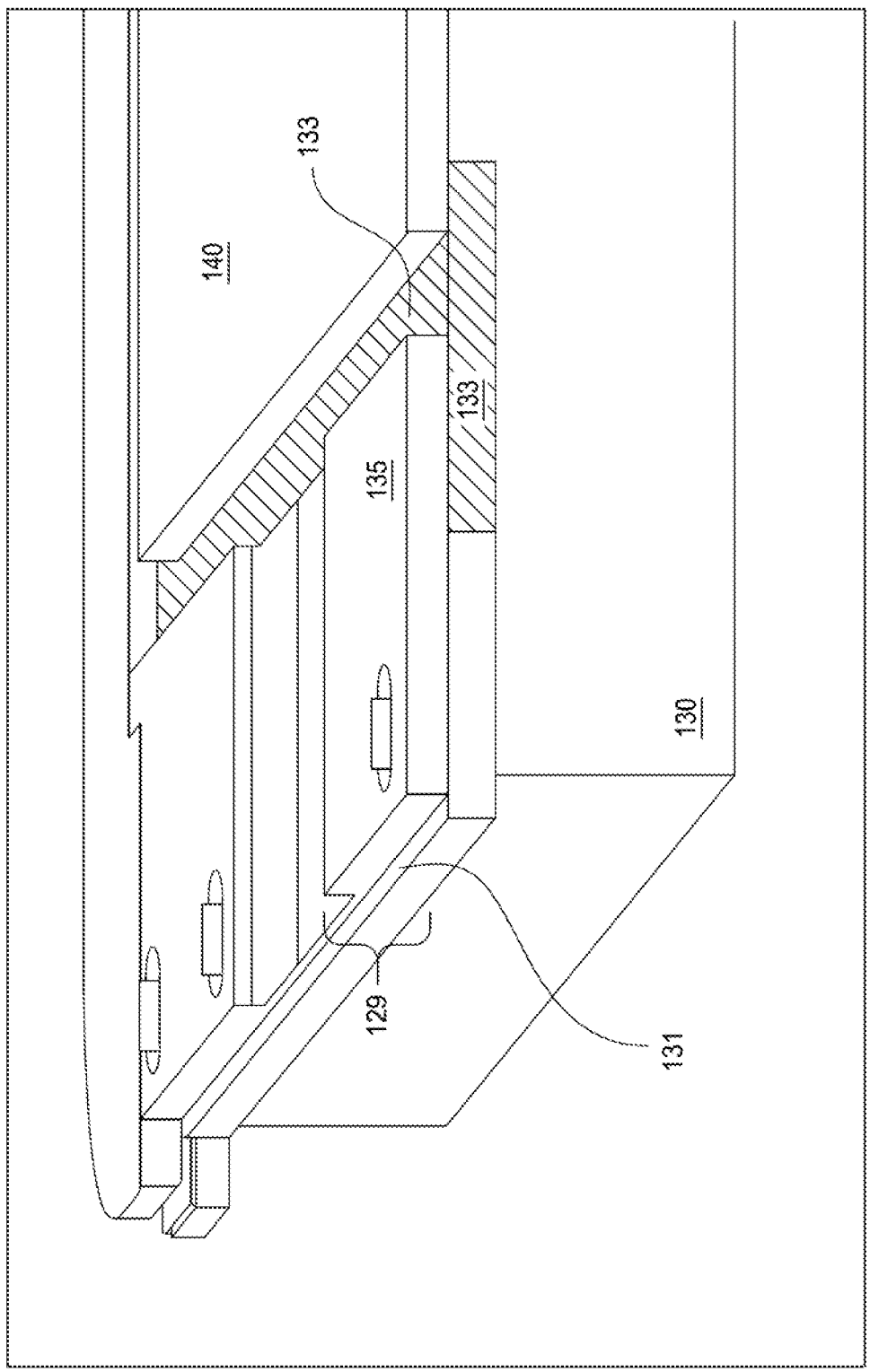
FIG. 5 is an isometric view of one embodiment of a gas confiner assembly.

FIG. 4 is a cross-sectional side view of one embodiment of a gas confiner assembly 129, which addresses many of the concerns of both the shadow frame illustrated in FIG. 3 and the removal of the shadow frame. The gas confiner 135 is disposed on a base 131, which in turn is disposed on a substrate support 130. The cover 133 is disposed on the substrate support 130 and prevents deposition on the substrate support 130. The gas confiner 135 is disposed on the cover 133 and the base 131 and is disposed around the periphery of the substrate 140. An inner perimeter and an outer perimeter of the as confiner 135 are disposed around a center of a substrate support 130. The base 131 has a lower surface supported on the substrate support 130, an upper inner surface, an inner side surface, and an outer upper surface to support the gas confiner 135. An outer lower surface of the cover 133 is supported by the inner upper surface and the inner side surface of the base 131. An inner lower surface of the cover 133 is supported by the substrate support 130. An inner perimeter of the cover 133 is less than an outer perimeter of a substrate 140 to be processed. A substrate support area is defined over an inner portion of an upper surface of the cover 133. An outer perimeter of the cover 133 is greater than the inner perimeter of the gas confiner 135 and less than the outer perimeter of the gas confiner 135 such that an outer portion of the upper surface of the cover and the outer upper surface of the base are adapted to support the gas confiner 135. FIG. 5 is an isometric view of one embodiment of a gas confiner assembly 129. The gas confiner 135 is positioned around the periphery of the substrate 140. Between the gas confiner 135 and the substrate 140 there is a gap 137. The cover 133, which is supported by the substrate support 130, is disposed underneath the gap 137 and protects the substrate support 130 from deposition.

The gas confiner assembly 129 is fabricated from a non-metal or glass. For example, the gas confiner assembly 129 may be fabricated from a ceramic, such as aluminum oxide ($Al_2O_3$). The base 131 is disposed on the substrate support 130, and in one embodiment, the base 131 includes one or more ceramic buttons (not shown) disposed on a side of the base 131 configured to face the substrate receiving surface 132 of the substrate support 130. The ceramic buttons may reduce the thermal and mechanical contact with the substrate support 130. The gas confiner 135 is coupled to the substrate support 130 through the base 131 disposed on the substrate support 130. In one embodiment, the base 131 includes one or more locating pins 202 for aligning with the gas confiner 132.

The cover 133 is coupled to the substrate support 130 between the base 131 and the gas confiner 135. The cover 133 is configured such that the substrate support 130 is not exposed to plasma during processing, even if the substrate 140 is misaligned on the substrate support 130. In one embodiment, the cover 133 includes one or more ceramic plates 200 joined at intersections or seams 206. The ceramic plates 200 are located on the top outer perimeter of the substrate support 130, and disposed under the outer perimeter of the substrate 140 (as shown in FIG. 1). One or more slotted locating pins 202 and fixed screws 204 are used to join the ceramic plates 200 to each other to form the cover 133. Due to the difference in the thermal expansion of the substrate support 130 material, e.g., aluminum, and the thermal expansion of the ceramic plates 200, the slotted locating pins 202 and fixed screws 204 prevent the cover ceramic plates 200 from opening at the seams 206. A distance between the center of the holes for the locating pins 202, and the holes for the fixed screws 204 is defined as "X". The distance X may be selected to allow the substrate support 130 to thermally expand more than the ceramic plates 200, while still preventing the ceramic plates 200 from forming substantial gaps at the seams 206. This advantageously prevents the substrate support 130 from being exposed to plasma even while thermally expanding at processing temperatures, e.g., 400 degrees Celsius.

Referring back to FIG. 1, the gas confiner 135 has a thickness between about 1 mm to about 9 mm, for example, about 3 mm or about 6 mm, and has a width between about 25 mm to about 75 mm, for example about 50 mm. A gap 137 may be formed between the edge of the substrate 140 and the gas confiner 135. In one embodiment, the gap 137 is between about 1 mm to about 5 mm, for example about 2 mm (or about 5 mm to about 6 mm at 400 degrees Celsius). As one skilled in the art would appreciate, the above recited materials and measurements of the gas confiner assembly 129, and more specifically, the gas confiner 135 and the gap 137 measurements may be selected based on the gases being flowed and the desired compensated gas flow rates.

Advantageously, embodiments of the gas confiner assembly 129 as described herein decrease the gas flow and compensate for high deposition rates on edge regions of substrates. The gas confiner assembly 129 changes the local gas flow below the gas confiner 135 by pushing the gas back below a height of the gas confiner 135 and moving the gas upwards. Therefore, the local gas distribution is decreased and consecutively, the local plasma density and deposition rates are also decreased. Thereby, overall film thickness uniformity, and in particular at the edge regions of 50 mm or less EE, is improved.

While the present disclosure is described in relation to a gas confiner assembly, it is contemplated that other barrier configurations are extendable to processing chamber hardware. For example, increasing or decreasing the thickness of shadow frames or introducing a thickness gradient to an existing shadow frame to compensate for the effects from using a shadow frame may be employed.

The overall uniformity of substrates similar to the substrate 140 were tested and the inventive gas confiner assembly showed the following beneficial results: (1) for amorphous silicon deposition, a gas confiner having a thickness of about 6 mm improved the normalized DR range from 6.8% to 4.5%, in the range of 10 mm to 50 mm at the edge, with a potential uniformity of 2.3% and overall uniformity was improved from 6.0% to 3.8% at 10 mm EE; (2) for high DR silicon nitride, a gas confiner having a thickness of about 6 mm improved the normalized DR range from 9.5% to 4.1%, with a potential uniformity of 2.1% and overall uniformity was improved from 4.3% to 3.6% at 10 mm EE; (3) for high DR silicon oxide, a gas confiner having a thickness of about 6 mm improved the normalized DR range from 8.5% to 2.5%, with a potential uniformity of 1.3% and overall uniformity was improved from 6.2% to 4.8%; (4) for low DR silicon nitride, a gas confiner having a thickness of about 3 mm improved the normalized DR range from 14.4% to 9.7%, with a potential uniformity of 4.8% and overall uniformity was improved from 12.9% to 7.7%; and (5) for low DR silicon oxide, a gas confiner having a thickness of about 6 mm improved the normalized DR range from 6.3% to 1.1%, with a potential uniformity of 0.6% and overall uniformity was improved from 7.4% to 6.8%.

While the foregoing is directed to embodiments of the present disclosure, other and further embodiments of the disclosure may be devised without departing from the basic scope thereof, and the scope thereof is determined by the claims that follow.

The invention claimed is:

1. A gas confiner assembly for a substrate support in a processing chamber, comprising:
    a gas confiner having an inner perimeter and an outer perimeter adapted to be disposed around a central axis of a substrate support;
    a base having:
        a lower surface adapted to be supported on a substrate support;
        an inner upper surface and an inner side surface; and
        an outer upper surface adapted to support the gas confiner and adapted to directly contact a lowermost surface of the gas confiner; and
    a cover having:
        an outer lower surface adapted to be supported by the inner upper surface and the inner side surface of the base;
        an inner lower surface adapted to be supported by a substrate support and adapted to directly contact the substrate support;
        an inner perimeter of the cover that is less than an outer perimeter of a substrate to be processed such that a substrate support area is defined over an inner portion of an upper surface of the cover, wherein the inner perimeter of the cover adapted to be disposed around the central axis of the substrate support and a the upper surface of the cover is exposed by a gap between the inner perimeter of the gas confiner and the outer perimeter of the substrate to be processed; and
        an outer perimeter of the cover that is greater than the inner perimeter of the gas confiner and that is less than the outer perimeter of the gas confiner such that an outer portion of the upper surface of the cover and the outer upper surface of the base are adapted to support the gas confiner and are adapted to directly contact the gas confiner, the outer perimeter of the cover adapted to be disposed around the central axis of the substrate support; and
    wherein the cover comprises four plates, wherein each plate has two opposite sides and two opposite ends, each side adjacent to the two opposite ends.

2. The gas confiner assembly of claim 1, wherein the base comprises aluminum oxide.

3. The gas confiner assembly of claim 1, wherein the gas confiner has an inner edge and the substrate has an outer edge, and a distance from the inner edge to the outer edge is between 1 mm and 5 mm.

4. The gas confiner assembly of claim 1, wherein the gas confiner has a thickness between about 1 mm and about 9 mm.

5. The gas confiner assembly of claim 1, wherein the cover is positioned to overlap the substrate by a distance of between about 5 mm and about 10 mm.

6. The gas confiner assembly of claim 1, wherein the gas confiner comprises aluminum oxide.

7. A processing chamber, comprising:
    a diffuser;
    a substrate support positioned opposite the diffuser; and
    a gas confiner assembly, comprising:
        a gas confiner having an inner perimeter and an outer perimeter adapted to be disposed around a central axis of the substrate support;
        a base having:
            a lower surface to be supported on the substrate support; and
            an inner upper surface and an inner side surface; and
            an outer upper surface adapted to support the gas confiner and adapted to directly contact a lowermost surface of the gas confiner; and
    a cover having:
        an outer lower surface adapted to be supported by the inner upper surface and the inner side surface of the base;
        an inner lower surface adapted to be supported by a substrate support and adapted to directly contact the substrate support;
        an inner perimeter of the cover that is less than an outer perimeter of a substrate to be processed such that a substrate support area is defined over an inner portion of an upper surface of the cover, wherein the inner perimeter of the cover adapted to be disposed around the central axis of the substrate support and the upper surface of the cover is exposed by a gap between the inner perimeter of the gas confiner and the outer perimeter of the substrate to be processed; and
        an outer perimeter of the cover that is greater than the inner perimeter of the gas confiner and that is less than the outer perimeter of the gas confiner such that an outer portion of the upper surface of the cover and the outer upper surface of the base are adapted to support the gas confiner and are adapted to directly contact the gas confiner, the outer perimeter of the cover adapted to be disposed around the center central axis of the substrate support;
        wherein the cover comprises four plates, wherein each plate has two opposite sides and two opposite ends, each side adjacent to the two opposite ends.

8. The processing chamber of claim 7, wherein the gas confiner comprises aluminum oxide.

9. The processing chamber of claim 7, wherein the gas confiner has an inner edge and the substrate has an outer edge, and a distance from the inner edge to the outer edge is configured to be between 1 mm and 5 mm.

10. The processing chamber of claim 7, wherein the gas confiner has a thickness between about 1 mm and about 9 mm.

11. The processing chamber of claim 7, wherein the cover is positioned to overlap the substrate by a distance of between about 5 mm and about 10 mm.

12. The processing chamber of claim 7, wherein a first end of a first plate is coupled to a first side of a second plate, the first side of the second plate being adjacent to a first end of the second plate and a second end of the second plate is coupled to a first side of a third plate.

13. The processing chamber of claim 12, wherein the plates comprise a ceramic material.

14. The processing chamber of claim 7, wherein the base comprises aluminum oxide.

15. The gas confiner assembly of claim 1, wherein a first end of a first plate is coupled to a first side of a second plate, the first side of the second plate being adjacent to a first end of the second plate and a second end of the second plate is coupled to a first side of a third plate.

16. The gas confiner assembly of claim 15, wherein the first end of the first plate is coupled to the first side of the second plate by a slotted locating pin and a fixed screw.

17. The gas confiner assembly of claim 15, wherein the plates comprise a ceramic material.

18. The processing chamber of claim 12, wherein the first end of the first plate is coupled to the first side of the second plate by a slotted locating pin and a fixed screw.

19. A gas confiner assembly for a substrate support in a processing chamber, comprising:
   a gas confiner having an inner perimeter and an outer perimeter adapted to be disposed around a central axis of a substrate support;
   a base having:
      a lower surface adapted to be supported on a substrate support; an inner upper surface and an inner side surface; and
      an outer upper surface adapted to support the gas confiner and adapted to directly contact a lowermost surface of the gas confiner; and
   a cover having:
      an outer lower surface adapted to be supported by the inner upper surface and the inner side surface of the base;
      an inner lower surface adapted to be supported by a substrate support and adapted to directly contact the substrate support;
      an inner perimeter of the cover that is less than an outer perimeter of a substrate to be processed such that a substrate support area is defined over an inner portion of an upper surface of the cover, wherein the inner perimeter of the cover adapted to be disposed around the central axis of the substrate support and the upper surface of the cover is exposed by a gap between the inner perimeter of the gas confiner and the outer perimeter of the substrate to be processed;
      an outer perimeter of the cover that is greater than the inner perimeter of the gas confiner and that is less than the outer perimeter of the gas confiner such that an outer portion of the upper surface of the cover and the outer upper surface of the base are adapted to support the gas confiner and are adapted to directly contact the gas confiner, the outer perimeter of the cover adapted to be disposed around the central axis of the substrate support; and
   wherein the cover comprises four plates, wherein each plate has two opposite sides and two opposite ends, each side adjacent to the two opposite ends, and wherein a first end of a first plate is coupled to a first side of a second plate, the first side of the second plate being adjacent to a first end of the second plate and a second end of the second plate is coupled to a first side of a third plate.

* * * * *